(12) United States Patent
Correa Vasquez et al.

(10) Patent No.: US 10,333,426 B2
(45) Date of Patent: Jun. 25, 2019

(54) INVERTER WITH IDENTIFICATION OF NEUTRAL CONNECTION

(71) Applicant: SMA Solar Technology AG, Niestetal (DE)

(72) Inventors: Pablo Ignacio Correa Vasquez, Bad Neustadt an der Saale (DE); Andreas Knobloch, Kassel (DE)

(73) Assignee: SMA Solar Technology AG, Niestetal (DE)

( * ) Notice: Subject to any disclaimer, the term of this patent is extended or adjusted under 35 U.S.C. 154(b) by 0 days.

(21) Appl. No.: 15/907,336

(22) Filed: Feb. 28, 2018

(65) Prior Publication Data

US 2018/0191270 A1    Jul. 5, 2018

Related U.S. Application Data

(63) Continuation of application No. PCT/EP2016/069992, filed on Aug. 24, 2016.

(30) Foreign Application Priority Data

Aug. 31, 2015  (DE) .................. 10 2015 114 452

(51) Int. Cl.
*H02M 7/537* (2006.01)
*H02M 7/487* (2007.01)
(Continued)

(52) U.S. Cl.
CPC ...... *H02M 7/487* (2013.01); *G01R 19/16547* (2013.01); *G01R 29/16* (2013.01);
(Continued)

(58) Field of Classification Search
CPC ........ H02M 1/10; H02M 7/5375; G01R 31/02
See application file for complete search history.

(56) References Cited

U.S. PATENT DOCUMENTS 4,589,046 A * 5/1986 Takata ..................... H02H 3/16
                                                              361/42
7,352,549 B1    4/2008 Greizer et al.
(Continued)

FOREIGN PATENT DOCUMENTS

EP    2608375       6/2016
JP    04001579 A *  1/1992

OTHER PUBLICATIONS

International Search Report dated Nov. 23, 2016 for International Application PCT/EP2016/06992, 2 pages.
(Continued)

*Primary Examiner* — Harry R Behm
(74) *Attorney, Agent, or Firm* — Eschweiler & Potashnik, LLC

(57) ABSTRACT

A method and system for operating an inverter, which has a terminal with four conductor connectors for connection of the inverter to three outer conductors and to a neutral conductor of an AC voltage grid is disclosed. The method includes determining a connection configuration of the inverter to the AC voltage grid by actuating switching elements of a bridge circuit of the inverter to generate a zero-phase sequence system having a zero-phase sequence system current, and measuring and evaluating output currents of the inverter with respect to the zero-phase sequence system current. The method also includes identifying a presence of a connection of the neutral conductor to a conductor connector provided for connection to the neutral conductor when the zero-phase sequence system current exceeds a prescribed threshold value and identifying that the neutral conductor is not connected to the conductor connector provided for connection to the neutral conductor otherwise.

14 Claims, 2 Drawing Sheets

(51) Int. Cl.
*G01R 31/42* (2006.01)
*G01R 29/16* (2006.01)
*G01R 31/02* (2006.01)
*H02M 1/36* (2007.01)
*G01R 19/165* (2006.01)
*G01R 31/04* (2006.01)
*H02M 1/08* (2006.01)
*H02M 7/5387* (2007.01)
*H02M 1/32* (2007.01)
*H02M 1/00* (2006.01)

(52) U.S. Cl.
CPC ......... *G01R 31/024* (2013.01); *G01R 31/041* (2013.01); *G01R 31/42* (2013.01); *H02M 1/08* (2013.01); *H02M 1/36* (2013.01); *H02M 7/53871* (2013.01); *G01R 19/165* (2013.01); *H02M 1/32* (2013.01); *H02M 2001/0009* (2013.01)

(56) References Cited

U.S. PATENT DOCUMENTS

| | | | |
|---|---|---|---|
| 8,717,038 B2 | 5/2014 | Stickelmann et al. | |
| 2009/0244936 A1 | 10/2009 | Falk et al. | |
| 2010/0172166 A1* | 7/2010 | Singh | H02M 1/42 363/131 |
| 2012/0249038 A1 | 10/2012 | Wei et al. | |
| 2013/0286697 A1* | 10/2013 | Eiland | H02J 3/26 363/71 |
| 2016/0268923 A1 | 9/2016 | Bremicker | |

OTHER PUBLICATIONS

El-Barbari, Said et al. "Digital Control of a Four Leg Inverter for Standalone Photovoltaic Systems with Unbalanced Load." IEEE, 2000. pp. 729-734.

* cited by examiner

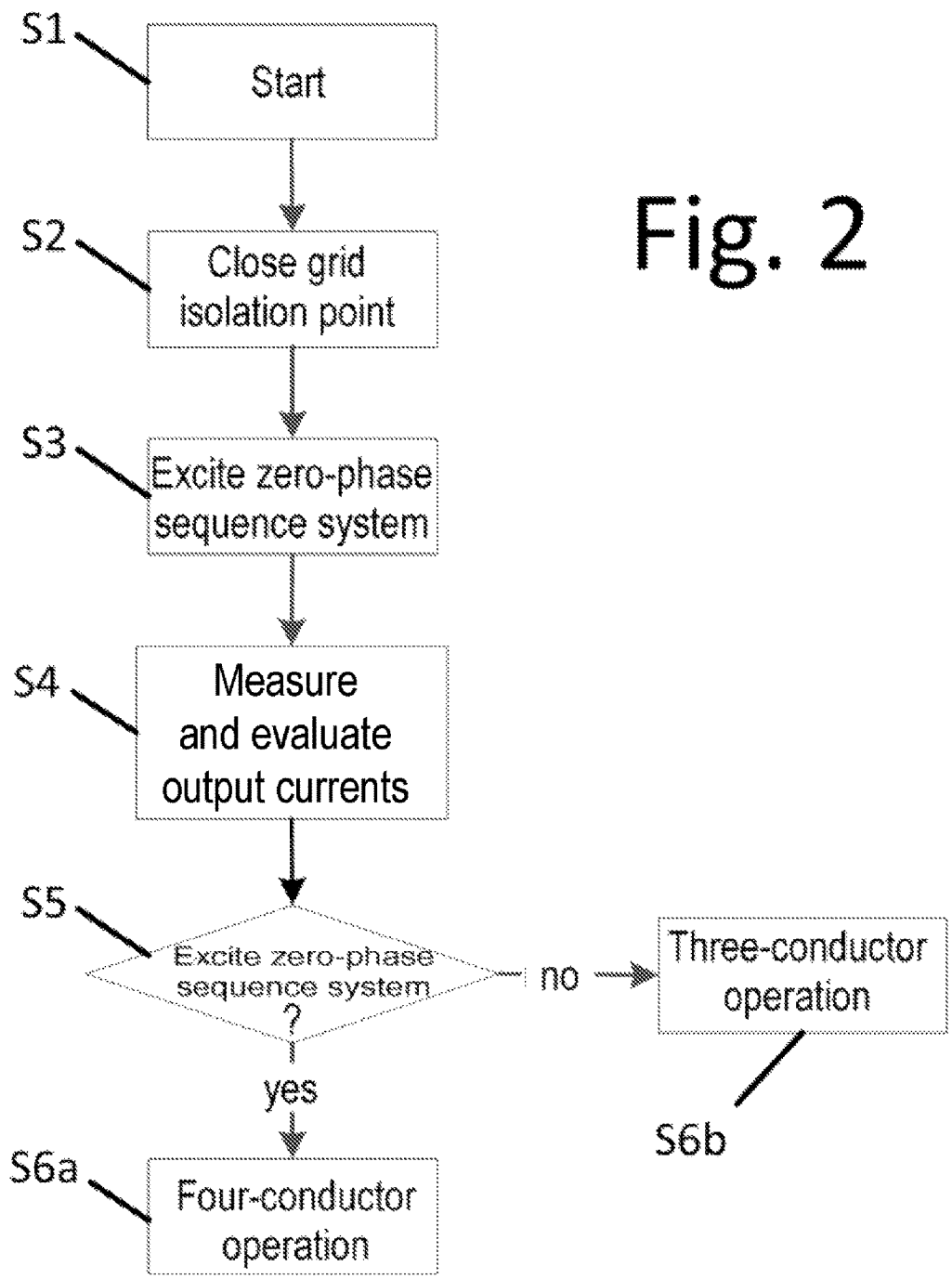

INVERTER WITH IDENTIFICATION OF NEUTRAL CONNECTION

CROSS-REFERENCE TO RELATED APPLICATIONS

This application is a continuation of PCT Patent Application Number PCT/EP2016/069992, filed on Aug. 24, 2016, which claims priority to German Patent Application Number DE 10 2015 114 452.2, filed on Aug. 31, 2015, which are hereby incorporated by reference in their entirety.

FIELD

The disclosure relates to a method for operating an inverter for converting electrical power of an energy generation unit and in-feeding the converted electrical power to an energy supply grid, and to an inverter using the method according to the disclosure.

BACKGROUND

Inverters can convert electrical power of an energy generation unit from direct current to alternating current and feed it into an energy supply grid, for example an AC voltage grid, and/or feed it in directly to an electrical load for the operation thereof. Generators, in particular, can be used here as the energy generation unit, said generators generating electrical power from renewable sources, for example photovoltaic or wind generators.

An inverter can be connected to an AC voltage grid in various ways. Particularly at powers from a few kilowatts, inverters can be used that feed into a three-phase AC voltage grid by means of a three-phase output. A three-phase AC voltage grid of this kind has three so-called outer conductors or phases, which are often referred to as L1, L2 and L3. In addition, a neutral conductor (N conductor for short, or simply N) and optionally a protective conductor (PE conductor for short, or simply PE) may be present, wherein N and PE can also be embodied as a combined PEN conductor. A four-conductor grid of this kind is referred to, in particular, as a TN system and is used, in particular, in the low-voltage range, for example in distribution grids.

In contrast to a TN system, a so-called IT system does not have a neutral conductor and thus constitutes a three-conductor grid. IT systems of this kind can be used, in particular, in energy generation installations with a plurality of inverters, which are connected to a superordinate distribution or transmission grid by means of a common grid connection point. In view of the costs for installation, it may be advantageous for an operator of an extensive energy generation installation with a plurality of inverters and a correspondingly large number and lengths of lines between the inverters and the grid connection point to form a 3-conductor grid, for example an IT grid.

The operation of an inverter is dependent on the actual embodiment of the AC voltage grid to which the inverter is connected. For example, a measurement of output voltages that is necessary for regulation of the output currents of the inverter may be done between the outer conductors and a reference-ground potential, wherein the reference-ground potential can be formed by the neutral conductor, when said conductor is present and connected to the inverter. If this is not the case, another potential, for example a ground potential, is to be selected as the reference-ground potential. Furthermore, protective measures such as residual current detection can be designed differently depending on whether a flow of current through a neutral conductor is possible or not. Parameterization of the regulation of the output currents and the generation of output currents with specific properties, for example asymmetrical output currents for stabilizing the AC voltage grid, depend on the presence of a neutral conductor and the connection thereof to the inverter.

Essentially two different types of operational management procedure of an inverter are known, which depend on the specific design of the energy generation installation comprising the inverters, in particular on the specific cabling within the energy generation installation or on the specific connection of the inverter to the AC voltage grid. An inverter, which is intended to be able to be used universally, can comprise, in principle, an output terminal, which is also provided for connection to an N conductor, wherein said connection does not necessarily have to be present and, in particular, is not used when the inverter is intended to feed into a 3-conductor grid without a neutral conductor.

EP 2251702 A1 discloses a wiring test apparatus for testing the wiring of an inverter, in which the inverter is configured for connection to a low-voltage three-phase grid having conductor voltages with respect to a neutral conductor on the grid side, wherein a measuring circuit is provided to measure the conductor voltages. In the case of a missing neutral conductor connection, voltage asymmetry is created on account of an additional element, in particular a capacitor, which is connected on the output side of the inverter between a phase and the neutral conductor, said voltage asymmetry being able to be determined by measuring the conductor voltages. Consequently, a fault message can be output in the event of a missing neutral conductor connection. The additional component generates additional costs and impairs the electromagnetic compatibility of the inverter by virtue of the fact that the properties of an output filter likewise arranged on the output side of the inverter is negatively influenced.

US 2009/0296289 A1 discloses a method for identifying a fault in a converter of a motor controller, wherein the input side of the converter is connected to an AC voltage grid and the output side of the converter has a three-phase connection for a load. An input-side and/or an output-side ground fault can be detected by virtue of the fact that the inverter attempts, based on the actuation thereof, to feed in a zero-phase sequence system current to the AC voltage grid. A fault signal is emitted when a zero-phase sequence system current is detected in the phase conductors connected to the inverter. A connection of the converter to a possible neutral conductor of the AC voltage grid is not disclosed.

SUMMARY

The disclosure is directed to a method for operating an inverter for converting electrical power of an energy generation unit and in-feeding the converted electrical power to an energy supply grid, wherein the inverter comprises output connectors for connection of three phases and of a neutral conductor of an AC voltage grid. The method is intended to make it possible to automatically identify, without additional components, whether the connector provided for the connection to the neutral conductor is actually connected to a neutral conductor.

A method for operating an inverter, which has a terminal with four conductor connectors for connection of the inverter to three outer conductors and to a neutral conductor of an AC voltage grid, comprises a checking step for determining a connection configuration of the inverter to the AC voltage grid. Switching elements of a bridge circuit of the inverter are actuated, as part of the checking step, to generate a zero-phase sequence system. Output currents of the inverter are measured and evaluated with respect to a zero-phase sequence system current. The presence of a connection of the neutral conductor to a conductor connector provided for connection to the neutral conductor is identified when, as part of the checking step, a zero-phase sequence system current that exceeds a prescribed threshold value is detected in the output currents. If this is not the case, that is to say when no or too low a zero-phase sequence system current is detected, it is identified that the neutral conductor (N) is not connected to the conductor connector provided for connection to the neutral conductor.

The disclosure is based on the finding that a zero-phase sequence system current can be fed in in a targeted manner only when the neutral conductor is connected to the inverter such that there is a closed circuit composed of the outer conductors and the neutral conductor by means of the inverter. It is indeed also possible for an asymmetric current to be fed into the outer conductors without the neutral conductor being connected, said current being able to reach a DC voltage input via any stray capacitances and hence likewise being able to flow along a closed circuit. A stray current of this kind has properties similar to a zero-phase sequence system current that flows via a neutral conductor but it has a significantly lower amplitude in the event of excitation, such that a zero-phase sequence system current that flows via the neutral conductor may be distinguished from a discharge current on the basis of the comparison of the detected zero-phase sequence system current with a prescribed threshold value.

The result of the checking step is used for the further operation of the inverter, in order to select an operational management procedure of the inverter suitable for the actually present connection configuration. When it has been identified, as part of the checking step, that there is a connection of the neutral conductor to the conductor connector provided for connection to the neutral conductor and a neutral conductor is thus connected to the inverter, for the further operation of the inverter, a first operational management procedure adjusted to four-conductor operation is selected. If this is not the case, a second operational management procedure adjusted to three-conductor operation is selected. It is possible by way of this automatic selection of the operational management procedure adjusted to the respective actual connection configuration to design an inverter, on the one hand, to be universally usable by virtue of the fact that it can be optimally operated both in a three-conductor grid and in a four-conductor grid. On the other hand, possible malfunctions are ruled out by virtue of the fact that the actual connection configuration is identified reliably and the operational management procedure of the inverter is adapted thereto, such that no functions which are unsuitable for the actual connection configuration are executed as part of the operational management procedure. Detection of electrical measurement values at the output of the inverter can thus be influenced by the actual connection configuration, for example, and specific functions as part of the operational management procedure, for example asymmetrical in-feeding to the outer conductors of the AC voltage grid, can be executed only when the neutral conductor is connected to the inverter.

In principle, an inverter can be preconfigured with a specific connection configuration by an operator for installation in a specific PV installation. To this end, a preset value stored in the inverter can be used to prescribe whether the inverter is to be operated in a feed-in mode on the basis of the first operational management procedure or on the basis of the second operational management procedure. In the event of a discrepancy between the operational management procedure prescribed by the preset value and the operational management procedure to be selected on account of the checking step, a warning message can be generated, which may be stored in the inverter and/or communicated to an operator of the inverter.

The inverter can subsequently be operated on the basis of the operational management procedure selected on account of the checking step. In this case, there may be provision, in the event of a discrepancy between the operational management procedure prescribed by the preset value and the operational management procedure selected on account of the checking step, for the inverter not to feed electrical energy into the AC voltage grid. As a result, in the presence of an actual connection configuration that deviates from the one for which the inverter is preconfigured, it is possible to automatically prevent the inverter from passing to a feed-in mode and from executing functions that are possibly undesired by an operator of the PV installation. A discrepancy of this kind can be checked before the operational management procedure is activated, in particular following the checking step, or as one of the first steps as part of the operational management procedure after it has been activated, in particular before the inverter feeds electrical power into the AC voltage grid.

In one embodiment of the method, there may be provision for the inverter to feed electrical power into the AC voltage grid, wherein the first operational management procedure may comprise, in particular, asymmetrical in-feeding of the output currents to the AC voltage grid. The in-feeding of electrical power can take place, in principle, independently of any discrepancy between the operational management procedure prescribed by the preset value and the operational management procedure selected on account of the checking step by virtue of the fact that the method ensures that the selection of an operational management procedure on account of the checking step corresponds to a reliable detection of the actually present connection configuration and the inverter can thus be operated on the basis of the operational management procedure selected on account of the checking step at least temporarily in a reliable manner using the actual present connection configuration. In the event of a discrepancy, it suffices to generate the abovementioned warning message and to optionally communicate it to the operator of the inverter.

The checking step may be executed as part of an activation of the inverter. As a result, it is possible to ensure that the connection configuration produced before activation of the inverter is taken into account in the operational management procedure of the inverter and any discrepancies with prescribed operational management procedures are revealed and processed.

In one embodiment of the method, as part of the checking step, the switching elements of the bridge circuit of the inverter can be actuated to generate a zero-phase sequence system at a frequency above a grid frequency. In particular, the frequency of the zero-phase sequence system can have a non-integer multiple of the grid frequency. As a result, it is ensured that the method operates independently of any influences of the properties of the connected AC voltage grid, in particular by virtue of the fact that grid-frequency components of stray currents or zero-phase sequence system currents from the AC voltage grid that are directed counter to the zero-phase sequence system generated by the inverter and the respective harmonics thereof are not taken into account in the evaluation of the zero-phase sequence system currents included in the checking step.

In a further embodiment of the method, as part of the checking step, a control structure can be used to actuate the switching elements of the bridge circuit of the inverter, in which control structure a setpoint value for the zero-phase sequence system current is compared with an actual value of the zero-phase sequence system current. By using a control structure of this kind, it is possible to implement the method in a particularly robust manner by virtue of the fact that the inverter seeks to feed in a zero-phase sequence system current that is above the threshold value and, to this end, successively increases necessary actuating variables, in particular output voltages of the inverter. Alternatively or in addition to a reaching of the threshold value, a deviation between the setpoint value of the zero-phase sequence system current and the actual value achievable using expedient actuating variables then constitutes a suitable criterion for identifying the presence of a neutral conductor by virtue of the fact that a small deviation indicates successful excitation and hence the connected neutral conductor, whereas a large deviation means that the setpoint value is not achievable and a zero-phase sequence system current cannot be generated, since a neutral conductor is not connected to the inverter.

An inverter for converting electrical power from direct current to alternating current and in-feeding the converted electrical power to an AC voltage grid comprises a terminal with four conductor connectors for connection of the inverter to three outer conductors and to a neutral conductor of an AC voltage grid. An inverter according to the disclosure comprises a control unit, which is configured to operate the inverter using a method illustrated in the preceding paragraphs of this description.

The conductor connector provided for the connection of the neutral conductor can in this case be connected to a center point of a DC-side voltage link circuit. Alternatively, the conductor connector provided for the connection of the neutral conductor can be connected to a connection between two semiconductor switching elements, wherein said semiconductor switching elements form a series circuit arranged in parallel with a DC-side voltage link circuit. In these cases, a further switching element can be provided between the conductor connector provided for the connection of the neutral conductor and the center point of a DC-side voltage link circuit or the connection between the semiconductor switching elements of the series circuit arranged in parallel with the DC-side voltage link circuit.

BRIEF DESCRIPTION OF THE DRAWINGS

The disclosure is further explained and described in the following text with reference to the exemplary embodiments illustrated in the figures.

FIG. 2 shows a block diagram of a method according to the disclosure for operating an inverter.

DETAILED DESCRIPTION

Figure 1:
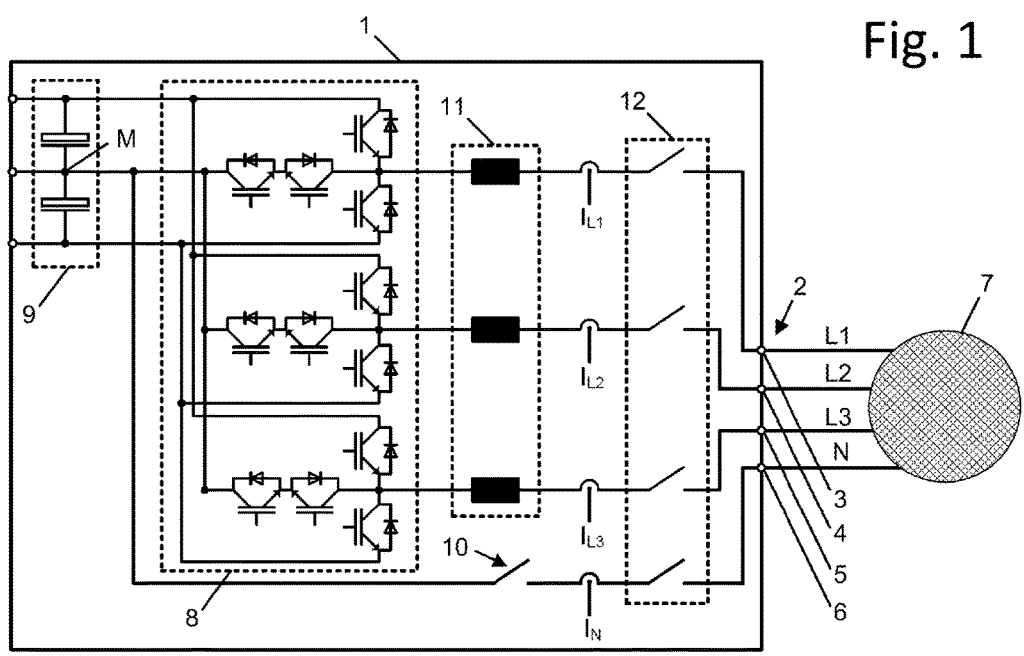
FIG. 1 schematically shows an inverter, which is connected to an AC voltage grid by means of a four-conductor system.

FIG. 1 shows an inverter 1, which has a terminal 2 with four conductor connectors 3-6. Three outer conductors L1, L2 and L3 of an AC voltage grid 7 are connected to the conductor connectors 3, 4 and 5. In accordance with FIG. 1, a neutral conductor N of the AC voltage grid 7 is connected to the conductor connector 6, wherein the connection of the neutral conductor N to the conductor connector 6 is, in principle, optional and is omitted, in particular, when the AC voltage grid 7 or the connection installations within an extensive PV installation comprising the inverter 1 do not have a neutral conductor at all.

The inverter 1 has a bridge circuit 8, which comprises a number of switching elements arranged in a plurality of bridge branches. The bridge circuit 8 can comprise various topologies and may be realized, for example, as a B6 bridge, as an NPC (Neutral Point Clamped) bridge or as what is known as a BS-NPC (Bidirectional Switch NPC) bridge illustrated in FIG. 1, wherein semiconductor switches, for example MOSFETs or IGBTs, can generally be used as the switching elements of the bridge circuit.

The input side of the inverter 1 comprises a DC link circuit 9, which, in the embodiment in accordance with FIG. 1, consists of a series circuit comprising two capacitances and comprises a center point M. The center point M is connected to the conductor connector 6 via a further switch 10, for example a relay. In an alternative embodiment, what is known as a three-phase four-leg inverter, a further bridge branch arranged in parallel with the DC link circuit 9 can be provided with a series circuit comprising two semiconductor switching elements, wherein the conductor connector 6 can be connected to a connection between the semiconductor switching elements of said series circuit. The DC link circuit 9 can then be formed in one piece when a connection to a center point M is likewise not provided for the bridge branches connected to the conductor connectors 3, 4 and 5, as is the case, for example, in a B6 bridge.

The output side of the inverter 1 comprises a filter 11 for smoothing output currents $I_{L1}$, $I_{L2}$, $I_{L3}$, wherein the output currents $I_{L1}$, $I_{L2}$, $I_{L3}$ are generated by means of the output voltage of the bridge circuit 8, said output voltage being clocked by the semiconductor switches. The output currents $I_{L1}$, $I_{L2}$, $I_{L3}$ are measured by means of current sensors and input as actual values into a controller of the inverter. The bridge circuit 8 and/or the DC link circuit 9 can be connected to the conductor connectors 3-6 by means of a switchable grid isolation point 12, in order to make it possible to feed the output currents $I_{L1}$, $I_{L2}$, $I_{L3}$ into the AC voltage grid 7 and, where necessary, in particular in the event of a fault, to isolate the electronics of the inverter 1 from the AC voltage grid 7 again.

The following text explains how the inverter 1 can be operated, in accordance with FIG. 1, in such a way that the presence of a neutral conductor and the connection thereof to the inverter can be detected automatically.

FIG. 2 shows an embodiment of the method according to the disclosure in the form of a block diagram. At S1, the inverter 1 is started, for example initially as part of an activation of a PV installation comprising the inverter 1 or in the morning when there is sufficient solar radiation on a photovoltaic generator connected to the inverter 1. At S2, the grid isolation point 12 is closed, that is to say a connection is established from the bridge circuit 8 via the conductor connectors 3, 4 and 5 to the outer conductors L1, L2 and L3 and from the center point M of the DC link circuit 9 via the conductor connector 6 to an optionally present neutral conductor N.

At S3, the switching elements of the bridge circuit 8 of the inverter 1 are actuated in such a way that a zero-phase sequence system at the terminal 2 of the inverter 1 is excited. To this end, the switching elements of a bridge branch can, for example, be actuated individually or several bridge branches can be actuated in phase with one another, with the result that an output current that comprises a zero-phase sequence system current or even consists exclusively of a zero-phase sequence system current is sought. Alternatively or in addition, setpoint values can be prescribed, for example, during regulation of the inverter 1, said setpoint values being compared with an actual value of an actually excited zero-phase sequence system current, said actual value being determined from the measured output currents $I_{L1}$, $I_{L2}$, $I_{L3}$. In this case, the actual values of the zero-phase sequence system current can be derived from the measured output currents $I_{L1}$, $I_{L2}$, $I_{L3}$ by means of a suitable transform, in particular by means of a transform from the time region in a coordinate system using what are known as dq0 components (Park transformation) or alpha-beta-zero components (Clarke transformation). As part of the control, it can then be sought, by means of a control loop, to bring the actual values closer to the setpoint values by suitable actuation of the switching elements of the bridge circuit 8.

At S4, the measured output currents $I_{L1}$, $I_{L2}$, $I_{L3}$ are evaluated in a targeted manner with respect to the zero-phase sequence system currents. This can be done on the basis of the transformation of the output currents $I_{L1}$, $I_{L2}$, $I_{L3}$ carried out as part of act S3 in the symmetrical coordinate system or else separately by means of a further suitable evaluation.

The result of act S4 represents an amplitude of a zero-phase sequence system current generated by the excitation at act S3. At S5, said result is evaluated with respect to whether a zero-phase sequence system current has been successfully excited or not. Said evaluation may comprise, for example, a comparison of the amplitude of the excited zero-phase sequence system current with a threshold value. Alternatively, in the regulation, the used setpoint and actual values of the zero-phase sequence system current can be compared, wherein a small control deviation between the setpoint and actual value of the zero-phase sequence system current indicates successful excitation of a zero-phase sequence system current.

At S6, it is determined that a zero-phase sequence system current can be excited successfully, it is identified that a neutral conductor N is connected to the inverter 1 by means of the conductor connector 6. In this case, the inverter 1 is operated in four-conductor operation in accordance with act S6*a*.

If, at S6, it is determined that a zero-phase sequence system current cannot be excited, it is identified that the neutral conductor N is not connected to the inverter 1 by means of the conductor connection 6 or that there is no neutral conductor N in connection installations of the inverter 1 or in the AC voltage grid 7. In this case, the inverter 1 is operated in three-conductor operation in accordance with act S6*b*.

In principle, the inverter 1 can itself also create or break a connection between the center point M and the neutral conductor N, provided this is present, by means of the switch 10 and can thus alternate from three-conductor to four-conductor operation and vice versa. The same applies to the above-described connection between the possibly present neutral conductor N and the series circuit of the further bridge branch of a three-phase four-leg inverter, said series circuit being arranged in parallel with the DC link circuit 9. Alternating the mode of operation in this way may be expedient, in particular, when the inverter 1 is intended to operate for as long as possible in three-conductor operation despite the neutral conductor N being present and connected, for example for reasons of efficiency, and is intended to operate in four-conductor operation by means of activation of the switch 10 only when it is necessary, that is to say when asymmetrical output currents $I_{L1}$, $I_{L2}$, $I_{L3}$ are intended to be generated for grid support, for example.

Advantageous developments of the disclosure will emerge from the patent claims, the description and the drawings. The advantages, cited in the description, of features and of combinations of multiple features are merely exemplary and can take effect alternatively or cumulatively without the advantages necessarily having to be attained from embodiments according to the disclosure. Without this altering the subject matter of the attached patent claims, the following applies in respect of the disclosure content of the original application documents and the patent: further features are evident from the drawings—particularly the depicted geometries and the relative dimensions of several components with respect to one another and the relative arrangement and operative connection thereof. The combination of features of different embodiments of the disclosure or of features of different patent claims is likewise possible as a departure from the selected back-references of the patent claims, and is encouraged hereby. This also relates to such features as are depicted in separate drawings or are cited in the description thereof. These features can also be combined with features of different patent claims. Similarly, features listed in the patent claims can be dispensed with for further embodiments of the disclosure.

In terms of their number, the features cited in the patent claims and the description can be understood to mean that precisely this number or a larger number than the cited number is present, without there being any need for explicit use of the adverb "at least". Thus, if reference is made to one element, for example, then this can be understood to mean that precisely one element, two elements or more elements are present. These elements can be supplemented by other elements or may be the only elements to which the respective method or the respective apparatus refers.

The reference symbols contained in the patent claims do not restrict the scope of the subjects protected by the patent claims. They merely serve the purpose of making the patent claims more easily understood.

What is claimed is:

1. A method for determining a connection configuration of an inverter to an AC voltage grid, the inverter having a terminal with four conductor connectors for connection of the inverter to three outer conductors and to a neutral conductor of the AC voltage grid, comprising:
   actuating switching elements of a bridge circuit of the inverter to generate a zero-phase sequence system having a zero-phase sequence system current;
   measuring and evaluating output currents of the inverter with respect to the zero-phase sequence system current;
   identifying a presence of a connection of the neutral conductor to a conductor connector provided for connection to the neutral conductor when the zero-phase sequence system current exceeds a prescribed threshold value and identifying that the neutral conductor is not connected to the conductor connector provided for connection to the neutral conductor otherwise; and
   using a control structure to actuate the switching elements of the bridge circuit of the inverter, in which the control structure compares a setpoint value for the zero-phase sequence system current with an actual value of the zero-phase sequence system current.

2. The method as claimed in claim 1, further comprising:
   selecting a first operational management procedure adjusted to four-conductor operation with connected neutral conductor when it has been identified that there is a connection of the neutral conductor to the conductor connector provided for connection to the neutral conductor; and selecting a second operational management procedure adjusted to three-conductor operation without connected neutral conductor otherwise, wherein the second operational management procedure is different from the first operational management procedure.

3. The method as claimed in claim 2, further comprising using a preset value stored in the inverter to prescribe whether the inverter is to be operated in a feed-in mode on the basis of the first operational management procedure or on the basis of the second operational management procedure.

4. The method as claimed in claim 3, further comprising generating a warning message in the event of a discrepancy between the operational management procedure prescribed by the preset value and the operational management procedure to be selected on account of the determining act, wherein the warning message is stored in the inverter and/or communicated to an operator of the inverter.

5. The method as claimed in claim 3, wherein in the event of a discrepancy between the operational management procedure prescribed by the preset value and the operational management procedure selected on account of the determining act, preventing the inverter from feeding electrical power into the AC voltage grid.

6. The method as claimed in claim 2, further comprising operating the inverter on the basis of the operational management procedure selected on account of the determining act.

7. The method as claimed in claim 6, wherein the inverter feeds electrical power into the AC voltage grid.

8. The method as claimed in claim 7, wherein the first operational management procedure comprises asymmetrical in-feeding of the output currents to the AC voltage grid.

9. The method as claimed in claim 1, wherein the determining act is executed as part of an activation and/or during a start-up process of the inverter.

10. The method as claimed in claim 1, wherein as part of the determining act, actuating the switching elements of the bridge circuit of the inverter to generate a zero-phase sequence system at a frequency above a grid frequency.

11. The method as claimed in claim 10, wherein the frequency of the zero-phase sequence system has a non-integer multiple of the grid frequency.

12. An inverter for converting electrical power from direct current to alternating current and in-feeding the converted electrical power to an AC voltage grid, wherein the inverter has a terminal with four conductor connectors for connection of the inverter to three outer conductors and to a neutral conductor of an AC voltage grid, wherein the inverter comprises a control unit configured to determine a connection configuration of the inverter to the AC voltage grid by:

actuating switching elements of a bridge circuit of the inverter to generate a zero-phase sequence system having a zero-phase sequence system current;

measuring and evaluating output currents of the inverter with respect to the zero-phase sequence system current;

identifying a presence of a connection of the neutral conductor to a conductor connector provided for connection to the neutral conductor when the zero-phase sequence system current exceeds a prescribed threshold value and identifying that the neutral conductor is not connected to the conductor connector provided for connection to the neutral conductor otherwise; and using a control structure to actuate the switching elements of the bridge circuit of the inverter, in which the control structure compares a setpoint value for the zero-phase sequence system current with an actual value of the zero-phase sequence system current.

13. The inverter as claimed in claim 12, wherein the conductor connector provided for the connection of the neutral conductor is connected to a center point of a DC link circuit.

14. The inverter as claimed in claim 13, wherein the conductor connector provided for the connection of the neutral conductor is connected by means of a switching element to the center point of the DC-side DC link circuit.

* * * * *